United States Patent
Kim et al.

(10) Patent No.: US 12,249,563 B2
(45) Date of Patent: Mar. 11, 2025

(54) SEMICONDUCTOR DEVICE

(71) Applicant: Samsung Electronics Co., Ltd., Suwon-si (KR)

(72) Inventors: Donguk Kim, Seoul (KR); Jinhee Hong, Hwaseong-si (KR); Jinmo Kwon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 652 days.

(21) Appl. No.: 17/473,481

(22) Filed: Sep. 13, 2021

(65) Prior Publication Data
US 2022/0199505 A1 Jun. 23, 2022

(30) Foreign Application Priority Data
Dec. 21, 2020 (KR) .................... 10-2020-0179819

(51) Int. Cl.
*H01L 23/498* (2006.01)
*H01L 23/00* (2006.01)
*H01L 25/065* (2023.01)

(52) U.S. Cl.
CPC ........ *H01L 23/49816* (2013.01); *H01L 24/16* (2013.01); *H01L 24/32* (2013.01); *H01L 25/0657* (2013.01); *H01L 2224/16227* (2013.01); *H01L 2224/32225* (2013.01); *H01L 2224/73204* (2013.01)

(58) Field of Classification Search
None
See application file for complete search history.

(56) References Cited

U.S. PATENT DOCUMENTS

| | | | |
|---|---|---|---|
| 5,973,931 A | * | 10/1999 | Fukasawa ............ H05K 3/3436 257/788 |
| 6,414,849 B1 | | 7/2002 | Chiu |
| 6,441,316 B1 | | 8/2002 | Kusui |
| 7,492,146 B2 | | 2/2009 | Behziz |
| 8,097,956 B2 | | 1/2012 | Kaenel |
| 9,337,522 B2 | | 5/2016 | Trotta et al. |

(Continued)

FOREIGN PATENT DOCUMENTS

JP 2001068836 A 3/2001
JP 5259383 B2 8/2013

(Continued)

*Primary Examiner* — Telly D Green
(74) *Attorney, Agent, or Firm* — Muir Patent Law, PLLC

(57) ABSTRACT

A semiconductor device includes a substrate comprising a redistribution layer, a ball land provided on a bottom surface of the redistribution layer, a passivation layer surrounding the ball land on the bottom surface of the redistribution layer and spaced apart from the ball land by a space region formed between the passivation layer and the ball land, and a signal wiring line provided in the redistribution layer on the ball land, a semiconductor chip mounted on the substrate, and an external terminal adhered to the ball land. The signal wiring line includes a first wiring pattern extending in a first direction perpendicular to one side surface of the semiconductor chip, and a support pattern disposed under the one side surface of the semiconductor chip. A second width of the support pattern in a second direction is greater than a first width of the wiring pattern in the second direction.

13 Claims, 13 Drawing Sheets

(56) References Cited

U.S. PATENT DOCUMENTS

| | | | |
|---|---|---|---|
| 9,502,345 B2* | 11/2016 | Youn .................. H01L 24/49 |
| 9,589,920 B2 | 3/2017 | Hurwitz et al. |
| 9,899,287 B2* | 2/2018 | Su ...................... H01L 24/06 |
| 11,450,583 B2* | 9/2022 | Choi ................. H01L 25/0657 |
| 2015/0123269 A1* | 5/2015 | Chen ................. H01L 23/5389 |
| | | | 257/737 |
| 2018/0240751 A1* | 8/2018 | Harr ................. H01L 23/3171 |
| 2018/0350774 A1* | 12/2018 | Chen .................. H01L 25/50 |
| 2020/0020637 A1* | 1/2020 | Kim ................. H01L 23/5383 |
| 2020/0105637 A1 | 4/2020 | Choi |

FOREIGN PATENT DOCUMENTS

| | | |
|---|---|---|
| JP | 6236940 B2 | 11/2017 |
| KR | 100244296 B1 | 3/2000 |
| KR | 100362796 B1 | 11/2002 |
| KR | 101329595 B1 | 11/2013 |

* cited by examiner under 35 U.S.C. § 119 to Korean Patent Application
SEMICONDUCTOR DEVICE

CROSS-REFERENCE TO RELATED APPLICATION

This U.S. non-provisional patent application claims priority under 35 U.S.C. § 119 to Korean Patent Application No. 10-2020-0179819, filed on Dec. 21, 2020, in the Korean Intellectual Property Office, the entire contents of which are hereby incorporated by reference.

BACKGROUND

The present inventive concepts relate to a semiconductor device and, more particularly, to a substrate used in a semiconductor device.

Small and light electronic devices have been demanded with the development of the electronic industry to meet the needs of users, and thus high-integration and large-capacity semiconductor devices corresponding to key components of the electronic devices have been increasingly demanded. Accordingly, semiconductor devices have been highly integrated.

Generally, a semiconductor chip may be mounted on a substrate by a wire bonding method or a flip-chip method. A density of wiring lines of a substrate on which a semiconductor chip is mounted may be increased by the high integration density of a semiconductor device, and thus reliable connection of the substrate may be required.

SUMMARY

Some example embodiments of the present inventive concepts may provide a semiconductor device with improved structural stability.

Some example embodiments of the present inventive concepts may also provide a semiconductor device with improved electrical characteristics.

According to some example embodiments of the present inventive concepts, a semiconductor device may include: a substrate comprising a redistribution layer, a ball land provided on a bottom surface of the redistribution layer, a passivation layer surrounding the ball land on the bottom surface of the redistribution layer and spaced apart from the ball land by a space region formed between the passivation layer and the ball land, and a signal wiring line provided in the redistribution layer and on the ball land; a semiconductor chip mounted on the substrate; and an external terminal adhered to the ball land. The signal wiring line may include a first wiring pattern extending in a first direction perpendicular to one side surface of the semiconductor chip, and a support pattern disposed under the one side surface of the semiconductor chip. The first wiring pattern may have a first width in a second direction, and the support pattern may have a second width in the second direction. The second width may be greater than the first width. The second direction may be parallel to a bottom surface of the substrate and may be perpendicular to the first direction. The support pattern may extend from on the passivation layer onto the ball land across the space region.

According to some example embodiments of the present inventive concepts, a semiconductor device may include: a substrate comprising an insulating pattern, a conductive pad in the insulating pattern, and a signal wiring line connected to the conductive pad in the insulating pattern; a semiconductor chip mounted on the substrate; and a molding layer covering the semiconductor chip on the substrate. One side surface of the semiconductor chip may vertically overlap the conductive pad. A first end of the signal wiring line may be located under the semiconductor chip, and a second end of the signal wiring line may be located outside the semiconductor chip in a plan view. The signal wiring line may include a support pattern located under the one side surface of the semiconductor chip and on a boundary of the conductive pad and the insulating pattern, a first wiring pattern extending from the support pattern toward the first end, and a second wiring pattern extending from the support pattern toward the second end. A width of the support pattern may be greater than a width of the first wiring pattern and greater than a width of the second wiring pattern. One of a boundary between the first wiring pattern and the support pattern and a boundary between the second wiring pattern and the support pattern may be located on the conductive pad.

DETAILED DESCRIPTION OF THE EMBODIMENTS

The following will now describe semiconductor devices according to example embodiments of the present disclosure with reference to the accompanying drawings.

Figure 1:
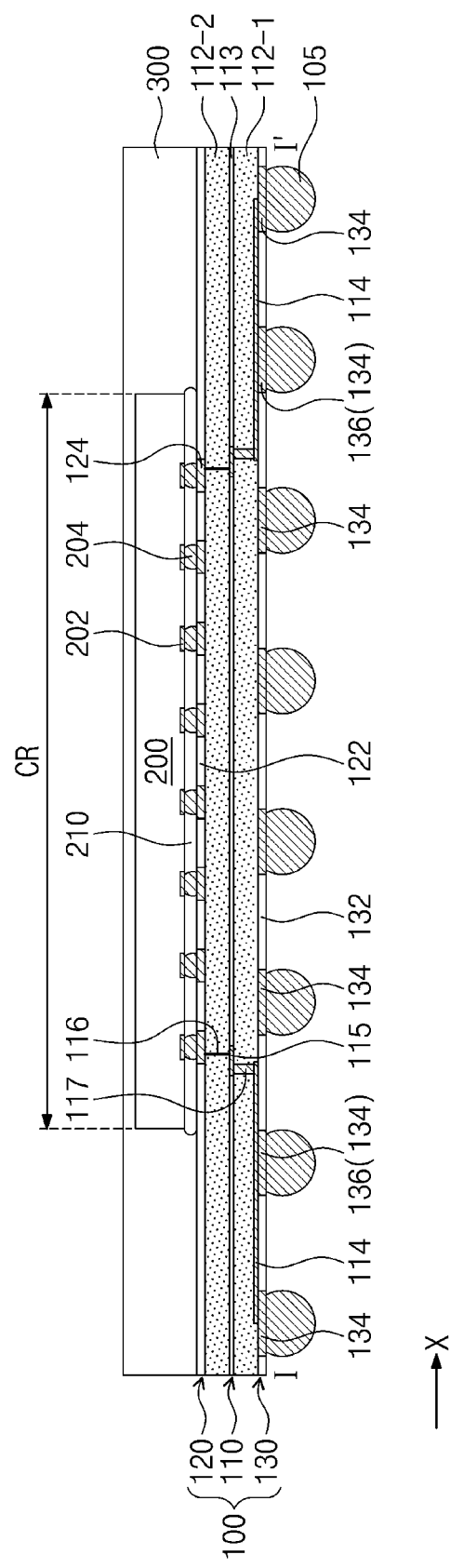
FIGS. 1 and 2 are cross-sectional views illustrating semiconductor devices according to some example embodiments of the present inventive concepts.
Figure 2:
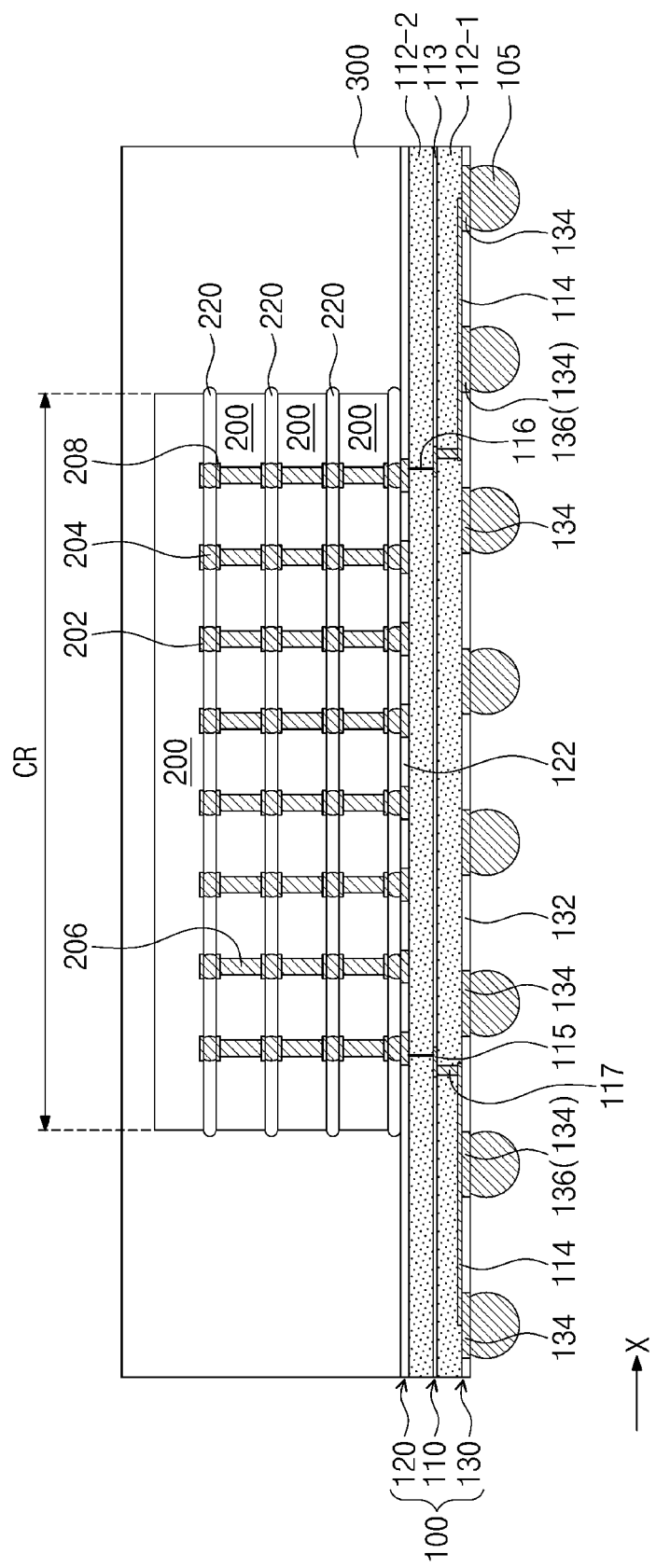

FIGS. 1 and 2 are cross-sectional views illustrating semiconductor devices according to some example embodiments of the present inventive concepts.

Referring to FIGS. 1 and 2, a substrate 100 may be provided. The substrate 100 may be a printed circuit board.

Circuit wiring lines may be provided at a top surface and a bottom surface of the substrate 100, and thus the substrate 100 may be a double-sided substrate. For example, the substrate 100 may be a double-sided printed circuit board. For example, the substrate 100 may include at least one redistribution layer 110, an upper layer 120 provided on the redistribution layer 110, and a lower layer 130 provided under the redistribution layer 110.

The upper layer 120 may include an upper passivation layer 122 and substrate pads 124. At least a portion of each of the substrate pads 124 may not be covered by the upper passivation layer 122 but may be exposed at a top surface of the upper layer 120. The substrate pads 124 may be pads for mounting a semiconductor chip 200 to be described later. The substrate pads 124 may include or be formed of a conductive material. The upper passivation layer 122 may include or be formed of an insulating material such as a solder resist.

The lower layer 130 may include a lower passivation layer 132 and ball lands 134. At least a portion of each of the ball lands 134 may not be covered by the lower passivation layer 132 but may be exposed at a bottom surface of the lower layer 130. The ball lands 134 may be pads on which external terminals 105 to be described later are provided. For example, the ball lands 134 may be conductive patterns which external terminals 105 may contact and/or be formed on. The ball lands 134 may include or be formed of a conductive material. The lower passivation layer 132 may include or be formed of an insulating material such as a solder resist.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The redistribution layer 110 may be disposed between the upper layer 120 and the lower layer 130. The redistribution layer 110 may include a core pattern 113, and first and second insulating patterns 112-1 and 112-2 covering a bottom surface and a top surface of the core pattern 113, respectively.

The core pattern 113 may correspond to a wiring line for redistributing the substrate pads 124. For example, the core pattern 113 may include a plurality of metal cores 115 spaced apart from each other, e.g., in a plan view or may include a single metal core 115 of which a portion is removed (e.g., patterned), e.g., in a plan view. The core pattern 113 may be buried in an insulating portion if necessary. The metal cores 115 may include or be formed of electrolytically deposited (ED) copper foil, rolled-annealed (RA) copper foil, stainless steel foil, aluminum foil, ultra-thin copper foil, sputtered copper, a copper alloy, or any combination thereof.

The first and second insulating patterns 112-1 and 112-2 may include at least one of pre-preg, flame retardant 4 (FR4), tetrafunctional epoxy, polyphenylene ether, epoxy/polyphenylene oxide, bismaleimide triazine (BT), thermount, cyanate ester, polyimide, or liquid crystal polymer.

The substrate pads 124 may be electrically connected to the ball lands 134 through wiring lines of the redistribution layer 110. For example, the metal core 115 of the redistribution layer 110 may be electrically connected to the substrate pads 124 through an internal wiring line 116 provided in the second insulating pattern 112-2. The internal wiring line 116 may include a via vertically penetrating the second insulating pattern 112-2 or may include at least one pattern of various wiring lines. For example, the metal core 115 of the redistribution layer 110 may be electrically connected to the ball lands 134 through a wiring via 117 vertically penetrating the first insulating pattern 112-1 and signal wiring lines 114 extending in a first direction X in the first insulating pattern 112-1.

As used herein, components described as being "electrically connected" are configured such that an electrical signal can be transferred from one component to the other (although such electrical signal may be attenuated in strength as it transferred and may be selectively transferred).

The components of the substrate 100 were schematically described above. However, the signal wiring lines 114 and the wiring via 117 of the redistribution layer 110 and the ball lands 134 of the lower layer 130 and the relation thereof will be described later in more detail.

The substrate 100 may have a chip mounting region CR. The chip mounting region CR may be located on a central portion of the substrate 100. The chip mounting region CR may be defined as a region on which a semiconductor chip 200 to be described later is disposed.

External terminals 105 may be provided under the substrate 100. The external terminals 105 may be attached or adhered to the ball lands 134 of the lower layer 130 of the substrate 100. The external terminals 105 may include or may be solder balls or solder bumps. The external terminals 105 may be electrically connected to a semiconductor chip 200 to be described later through the ball lands 134, the redistribution layer 110 and the substrate pads 124.

A semiconductor chip 200 may be mounted on the substrate 100. The semiconductor chip 200 may have a bottom surface facing the substrate 100 and a top surface opposite to the bottom surface. The semiconductor chip 200 may include at least one integrated device therein. The at least one integrated device may be formed in a lower portion of the semiconductor chip 200. For example, the bottom surface of the semiconductor chip 200 may be an active surface. In some embodiments, the semiconductor chip 200 may be a memory semiconductor chip. In some examples, the memory semiconductor chip may be a non-volatile memory semiconductor chip such as a flash memory chip, a phase-change random access memory (PRAM) chip, a magnetoresistive random access memory (MRAM) chip, a ferroelectric random-access memory (FeRAM) chip, or a resistive random-access memory (RRAM) chip. The flash memory chip may be, for example, a V-NAND flash memory chip. In some other examples, the semiconductor chip 200 may be a volatile memory semiconductor chip such as a dynamic random-access memory (DRAM) chip or a static random-access memory (SRAM) chip. Alternatively, the semiconductor chip 200 may be a logic semiconductor chip.

The semiconductor chip 200 may be mounted on the substrate 100 by a flip-chip method. For example, the semiconductor chip 200 may be disposed face-down on the substrate 100. For example, the semiconductor chip 200 may be disposed in such a way that the active surface of the semiconductor chip 200 faces the substrate 100. At this time, the semiconductor chip 200 may be disposed on the chip mounting region CR of the substrate 100. The semiconductor chip 200 may have first chip pads 202 provided on the active surface (e.g., the bottom surface) of the semiconductor chip 200. The first chip pads 202 may be electrically connected to the at least one integrated device of the semiconductor chip 200. The semiconductor chip 200 may be electrically connected to the substrate 100 through chip terminals 204. The chip terminals 204 may be provided between the substrate pads 124 of the substrate 100 and the first chip pads 202 of the semiconductor chip 200. The chip terminals 204 may include or may be, for example, micro bumps.

A space between the semiconductor chip 200 and the substrate 100 may be filled with an underfill 210. The underfill 210 may surround the chip terminals 204. The underfill 210 may include or may be an epoxy, a silicon-based insulating layer, or a tape.

In certain embodiments, a plurality of semiconductor chips 200 may be provided on the substrate 100. As illustrated in FIG. 2, the plurality of semiconductor chips 200 may be sequentially stacked on the substrate 100 in a vertical direction of the substrate 100. In this case, each of the semiconductor chips 200 may further include second chip pads 208 provided on top surfaces of the semiconductor chips 200, and chip vias 206 vertically penetrating the semiconductor chips 200 to electrically connect the first chip pads 202 to the second chip pads 208. Each of some of the semiconductor chips 200 may be mounted using chip terminals 204 provided on the second chip pads 208 of another semiconductor chip 200 disposed thereunder. Each of the semiconductor chips 200 may have a die adhesive film 220 adhered to the bottom surface thereof. The die adhesive films 220 may be provided between the semiconductor chips 200, and each of the die adhesive films 220 may adhere to a bottom surface of a corresponding semiconductor chip 200 and to a top surface of another semiconductor chip 200 provided thereunder. The chip terminals 204 provided between the semiconductor chips 200 to electrically connect the semiconductor chips 200 may be surrounded by the die adhesive films 220. The die adhesive films 220 may be formed of, for example, an inorganic adhesive or a polymer adhesive. The polymer adhesive may be formed of, for example, a thermosetting polymer or a thermoplastic polymer. An uppermost semiconductor chip 200 may not include second chip pads 208 and chip vias 206.

Alternatively, even though not shown in the drawings, the plurality of semiconductor chips 200 may be stacked in a staircase shape to have substantially equal intervals along a direction parallel to the top surface of the substrate 100. For example, the plurality of semiconductor chips 200 may be stacked in a cascade type on the substrate 100. In this case, the semiconductor chips 200 may be disposed face-up. For example, the semiconductor chips 200 may be disposed in such a way that the active surfaces of the semiconductor chips 200 do not face the substrate 100. A portion of the active surface (e.g., the top surface) of each of the semiconductor chips 200 may be exposed. Chip pads 202 may be disposed on the exposed top surfaces of the semiconductor chips 200, and the chip pads 202 may be electrically connected to the substrate pads 124 of the substrate 100 by a wire bonding method. Hereinafter, the embodiments of FIG. 1 will be described continuously as examples.

A molding layer 300 may be provided on the substrate 100. The molding layer 300 may cover the semiconductor chip 200. The molding layer 300 may protect the semiconductor chip 200 from an external environment. The molding layer 300 may include an epoxy molding compound (EMC).

Figure 3:
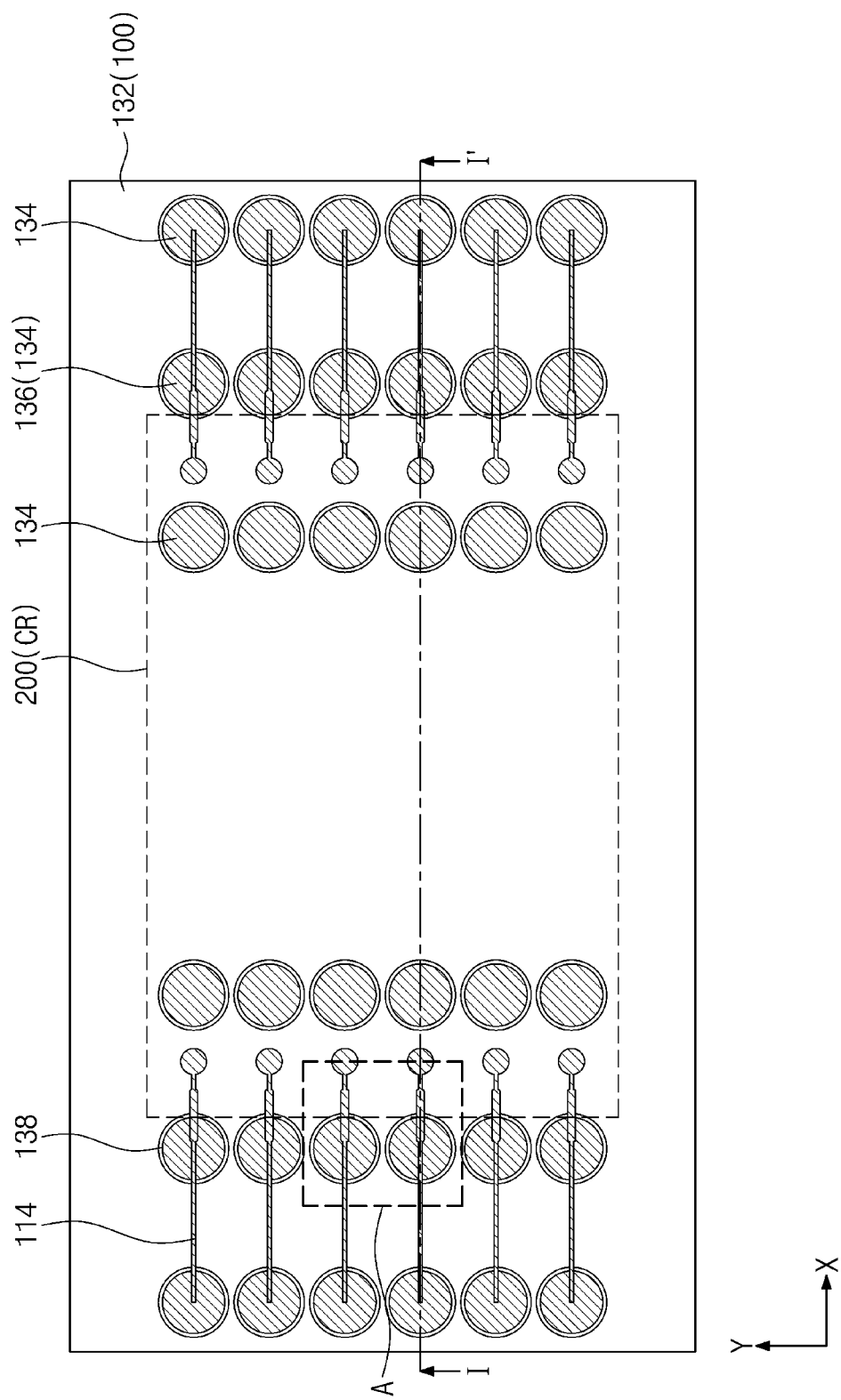
FIG. 3 is a plan view illustrating a semiconductor device according to some example embodiments of the present inventive concepts.
Figure 4:
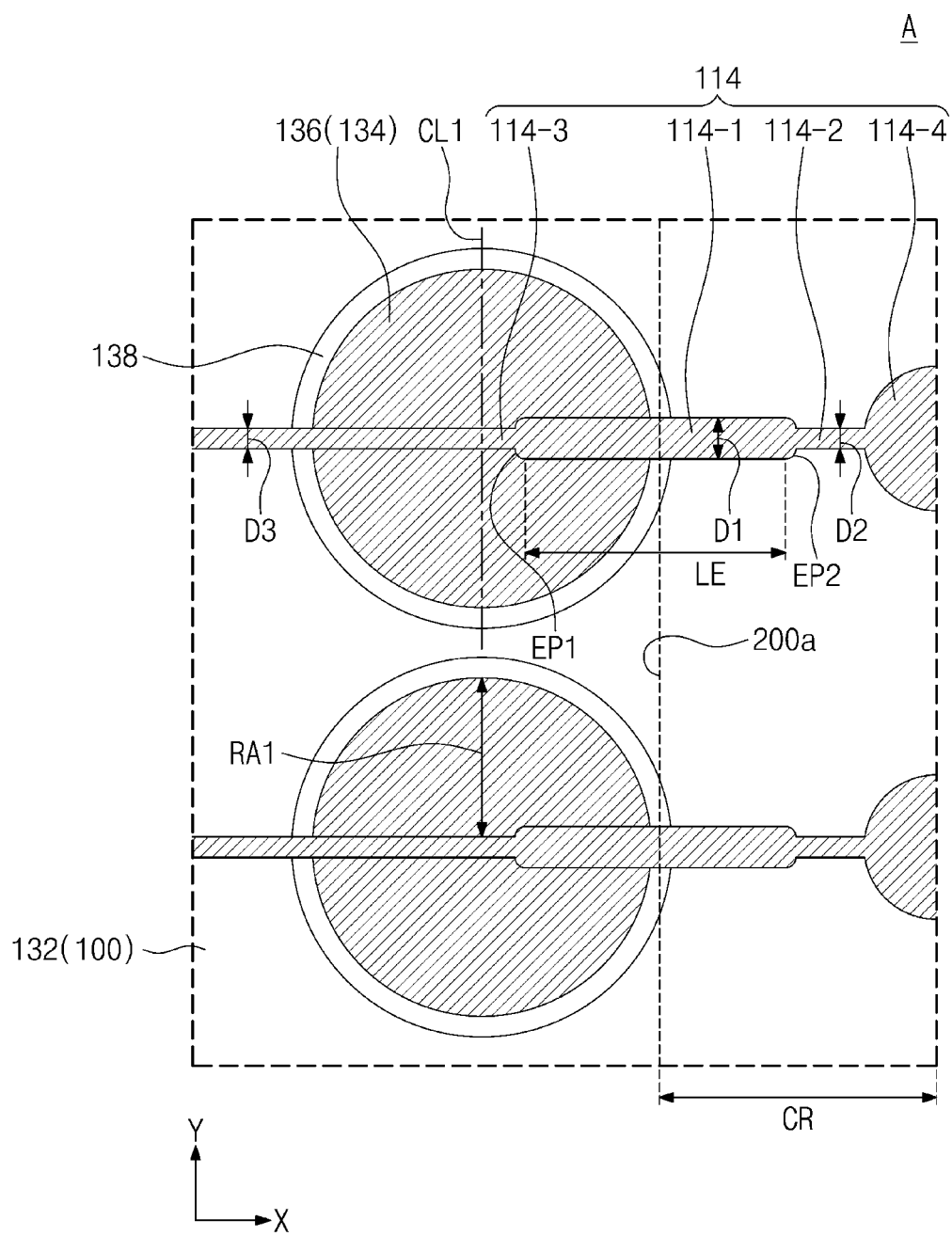
FIG. 4 is an enlarged view illustrating signal wiring lines of a semiconductor device according to some example embodiments of the present inventive concepts.

FIG. 3 is a plan view illustrating a semiconductor device according to some example embodiments of the present inventive concepts. FIG. 4 is an enlarged view illustrating signal wiring lines of a semiconductor device according to some example embodiments of the present inventive concepts. FIG. 3 is a plan view showing a top of the lower layer of the substrate of FIG. 1, and FIG. 1 corresponds to a cross-sectional view taken along a line I-I' of FIG. 3. FIG. 4 is an enlarged view of a region 'A' of FIG. 3. In FIGS. 3 and 4, a portion overlapping the semiconductor chip 200 or the chip mounting region CR is illustrated by a dotted line for the purpose of ease and convenience in explanation and illustration.

Referring to FIGS. 1, 3 and 4, the ball lands 134 of the lower layer 130 may have circular planar shapes. Unlike FIGS. 3 and 4, the ball lands 134 may have tetragonal or polygonal planar shapes. A width of each of the ball lands 134 may range from 240 µm to 480 µm. For example, when the ball lands 134 have the circular planar shapes, a radius RA1 of each of the ball lands 134 may range from 120 µm to 240 µm.

Some of the ball lands 134 of the lower layer 130 may be disposed near the chip mounting region CR. For the purpose of ease and convenience in explanation, the some of the ball lands 134, which are disposed adjacent to the chip mounting region CR, may be referred to as boundary ball lands 136. As illustrated in FIGS. 3 and 4, the boundary ball lands 136 may be disposed adjacent to both side surfaces 200a of the semiconductor chip 200 in the first direction X. For example, the boundary ball lands 136 may be located outside the side surfaces 200a of the semiconductor chip 200, e.g., in a plan view. The boundary ball lands 136 may be arranged along the side surfaces 200a of the semiconductor chip 200, which extends in a second direction Y. The other ball lands 134 except the boundary ball lands 136 may be located under the semiconductor chip 200 and/or may be located outside the semiconductor chip 200, e.g., in a plan view. Here, the other ball lands 134 except the boundary ball lands 136 may be spaced apart from the side surfaces 200a of the semiconductor chip 200, e.g., in a plan view.

As illustrated in FIG. 4, the ball lands 134 may be located inside the lower passivation layer 132, e.g., in a plan view. Here, the ball lands 134 may be spaced apart from the lower passivation layer 132. For example, in a process of manufacturing the substrate 100, adhesive strength between the lower passivation layer 132 including a solder resist material and the ball lands 134 including a solder material or a metal material may be very low, and the ball lands 134 may be formed to be spaced apart from the lower passivation layer 132. Hereinafter, a space/gap between the ball land 134 and the lower passivation layer 132 is referred to and/or defined as a space region 138. A distance between the ball land 134 and the lower passivation layer 132 (i.e., a width of the space region 138) may range from 20 µm to 40 µm.

A portion of the space region 138 surrounding the boundary ball land 136 may be located under the side surface 200a of the semiconductor chip 200. When the semiconductor chip 200 is mounted on the substrate 100, pressure applied to the substrate 100 by a weight of the semiconductor chip 200 or pressure applied in a process of mounting the semiconductor chip 200 may be great at an edge (e.g., the side surface 200a) of the semiconductor chip 200. At this time, the signal wiring lines 114 and the internal wiring line 116 of the redistribution layer 110 on the ball lands 134 and the lower passivation layer 132 may be supported by the ball lands 134 and the lower passivation layer 132, but the signal wiring lines 114 and the internal wiring line 116 of the redistribution layer 110 on the space region 138 may not be supported by the ball lands 134 and the lower passivation layer 132. For example, the signal wiring lines 114 and the internal wiring line 116 of the redistribution layer 110 on the space region 138 may be easily damaged or broken. According to some embodiments of the inventive concepts, structural stability of the signal wiring line 114 on the space region 138 may be improved. This will be described later in detail with detailed descriptions to a structure of the signal wiring line 114.

Continuously referring to FIGS. 1, 3 and 4, the redistribution layer 110 may include the core pattern 113 corresponding to a redistribution line (e.g., a conductor pattern) in the redistribution layer 110, the wiring via 117 and the signal wiring lines 114 disposed in the first insulating pattern 112-1, and the internal wiring line 116 disposed in the second insulating pattern 112-2. The redistribution line of the redistribution layer 110 may electrically connect the substrate pads 124 of the upper layer 120 to the ball lands 134 of the lower layer 130. In the present embodiments, some wiring lines disposed in the first insulating pattern 112-1 and electrically connected to the ball lands 134 may be defined as the signal wiring lines 114, and a wiring line disposed in the second insulating pattern 112-2 to electrically connect the core pattern 113 to the substrate pads 124 may be defined as the internal wiring line 116. For example, the signal wiring lines 114 may be disposed on the ball lands 134 and on the lower layer 130 and may be connected directly to the ball lands 134. The wiring via 117 may electrically connect the signal wiring line 114 to the core pattern 113. The internal wiring line 116 may electrically connect the core pattern 113 to the substrate pad 124.

The signal wiring lines 114 may laterally extend from under the semiconductor chip 200 to protrude from the side surface 200a of the semiconductor chip 200, e.g., in a plan view. For example, an end portion of the signal wiring line 114 may be located under the semiconductor chip 200, and another end portion of the signal wiring line 114 may be located outside the semiconductor chip 200 in a plan view. For example, one end of the signal wiring line 114 may vertically overlap the semiconductor chip 200 and the other of the signal wiring line 114 may not vertically overlap the semiconductor chip 200. Here, the signal wiring line 114 may intersect/overlap one of the boundary ball lands 136 located under the side surface 200a of the semiconductor chip 200. The signal wiring lines 114 may extend from under the side surface 200a of the semiconductor chip 200 in a direction perpendicular to the side surface 200a of the semiconductor chip 200 (i.e., in the first direction X).

Each of the signal wiring lines 114 may include a support pattern 114-1 located on one of the boundary ball lands 136, first and second wiring patterns 114-2 and 114-3 extending from the support pattern 114-1, and a pad pattern 114-4 to which the wiring via 117 is electrically connected. Hereinafter, one of the signal wiring lines 114 will be described as a representative of the signal wiring lines 114.

The pad pattern 114-4 may be disposed under the semiconductor chip 200. The pad pattern 114-4 may be disposed at a side of the boundary ball land 136 in the first direction X, e.g., in a plan view. For example, the pad pattern 114-4 may be spaced apart from the boundary ball land 136 in the first direction X. The wiring via 117 may be electrically connected to the pad pattern 114-4. The pad pattern 114-4 may correspond to the end portion of the signal wiring line 114, which is located under the semiconductor chip 200.

The support pattern 114-1 may be located on the boundary ball land 136. The support pattern 114-1 may extend in the direction perpendicular to the side surface 200a of the semiconductor chip 200. For example, the support pattern 114-1 may extend in the first direction X. Here, a first end portion EP1 of the support pattern 114-1 may be located on the boundary ball land 136, and a second end portion EP2 of the support pattern 114-1 may be located on the lower passivation layer 132. For example, a first end of the support pattern 114-1 may be located on the boundary ball land 136, and a second end of the support pattern 114-1 may be located on the lower passivation layer 132. For example, the first and second end portions EP1 and EP2 of the support pattern 114-1 may include respective ends. Therefore, specific details about the first and second end portions EP1 and EP2 may correspondingly be applied to respective ends. This may be similarly applied the other end portions described in this disclosure. A portion of the support pattern 114-1 may be located under the semiconductor chip 200 and another portion of the support pattern 114-1 may be located at a side of the semiconductor chip 200, e.g., in a plan view. The first end portion EP1 of the support pattern 114-1 may be located outside the side surface 200a of the semiconductor chip 200, e.g., in a plan view. The first end portion EP1 of the support pattern 114-1 may be spaced apart from a center of the boundary ball land 136. For example, as illustrated in FIG. 4, the boundary ball land 136 may be divided into two parts by an imaginary first center line CL1 extending in the second direction Y, and the first end portion EP1 of the support pattern 114-1 may be spaced apart from the first center line CL1, e.g., in the first direction X toward the semiconductor chip 200. For example, the first end portion EP1 of the support pattern 114-1 may be located between the side surface 200a of the semiconductor chip 200 and the first center line CL1 of the boundary ball land 136, e.g., in a plan view. The second end portion EP2 of the support pattern 114-1 may be located under the semiconductor chip 200. For example, the support pattern 114-1 may extend from under the semiconductor chip 200 onto the boundary ball land 136 via the space region 138. A portion of the support pattern 114-1 vertically overlapping with the space region 138 may be located under the side surface 200a of the semiconductor chip 200. For example, the side surface 200a of the semiconductor chip 200 may vertically overlap the space region 138 and the support pattern 114-1. A length LE of the support pattern 114-1 in the first direction X may range from 0.4 times to 0.6 times the width of the boundary ball land 136, e.g., in the first direction X. For example, the length LE of the support pattern 114-1 in the first direction X may range from 0.8 times to 1.2 times the radius RA1 of the boundary ball land 136.

The first wiring pattern 114-2 may electrically connect the support pattern 114-1 and the pad pattern 114-4. For example, the first wiring pattern 114-2 may be disposed under the semiconductor chip 200. The first wiring pattern 114-2 may extend from the second end portion EP2 of the support pattern 114-1 to the pad pattern 114-4 in the first direction X.

The second wiring pattern 114-3 may be connected to the support pattern 114-1. For example, the second wiring pattern 114-3 may extend from the first end portion EP1 of the support pattern 114-1 located on the boundary ball land 136 toward another ball land 134 adjacent to the boundary ball land 136 in an opposite direction to the first direction X. A contact point of the second wiring pattern 114-3 and the support pattern 114-1 may be located on the boundary ball land 136. For example, the contact point of the second wiring pattern 114-3 and the support pattern 114-1 may be a boundary between the second wiring pattern 114-3 and the support pattern 114-1. The boundary ball land 136 and the other ball land 134 may be electrically connected to the internal wiring line 116 through the pad pattern 114-4, the first wiring pattern 114-2, the support pattern 114-1 and the second wiring pattern 114-3 of the signal wiring line 114. An end portion of the second wiring pattern 114-3 may correspond to the other end portion of the signal wiring line 114, which is located outside the semiconductor chip 200, e.g., in a plan view. In FIG. 3, the second wiring pattern 114-3 extends onto the other ball land 134. However, embodiments of the inventive concepts are not limited thereto. In certain embodiments, the end portion of the second wiring pattern 114-3 may be located on the lower passivation layer 132 adjacent to the boundary ball land 136.

A width D1 of the support pattern 114-1 may be greater than a width D2 of the first wiring pattern 114-2 and a width D3 of the second wiring pattern 114-3. For example, the width D2 of the first wiring pattern 114-2 may be substantially equal to the width D3 of the second wiring pattern 114-3. The width D1 of the support pattern 114-1 may range from 1.5 times to 3 times each of the widths D2 and D3 of the first and second wiring patterns 114-2 and 114-3. For example, the widths D1, D2 and D3 may be respective distances between opposite sides in the first direction X.

According to the embodiments of the inventive concepts, the signal wiring line 114 may have the support pattern 114-1 having a relatively thick/wide width on the space region 138. Thus, it is possible to prevent the signal wiring line 114 from being damaged by pressure applied from the edge of the semiconductor chip 200 (i.e., a portion adjacent to the side surface 200a of the semiconductor chip 200). As a result, structural stability of the semiconductor device may be improved. In addition, it is possible to prevent the signal wiring line 114 from being damaged by an external impact or pressure applied in a process of mounting the semiconductor chip, and thus electrical characteristics of the semiconductor device may be improved.

The first wiring pattern 114-2, the support pattern 114-1 and the second wiring pattern 114-3 may be aligned or arranged in the first direction X. The first wiring pattern 114-2, the support pattern 114-1, the second wiring pattern 114-3 and the pad pattern 114-4 may constitute one body. For example, the first wiring pattern 114-2, the support pattern 114-1, the second wiring pattern 114-3 and the pad pattern 114-4 may be formed of the same material. For example, the signal wiring line 114 may include or be formed of copper (Cu). For example, the support pattern 114-1, the first and second wiring patterns 114-2 and 114-3, and the pad pattern 114-4 may be integrally formed by a process forming a conductive pattern.

Figure 5:
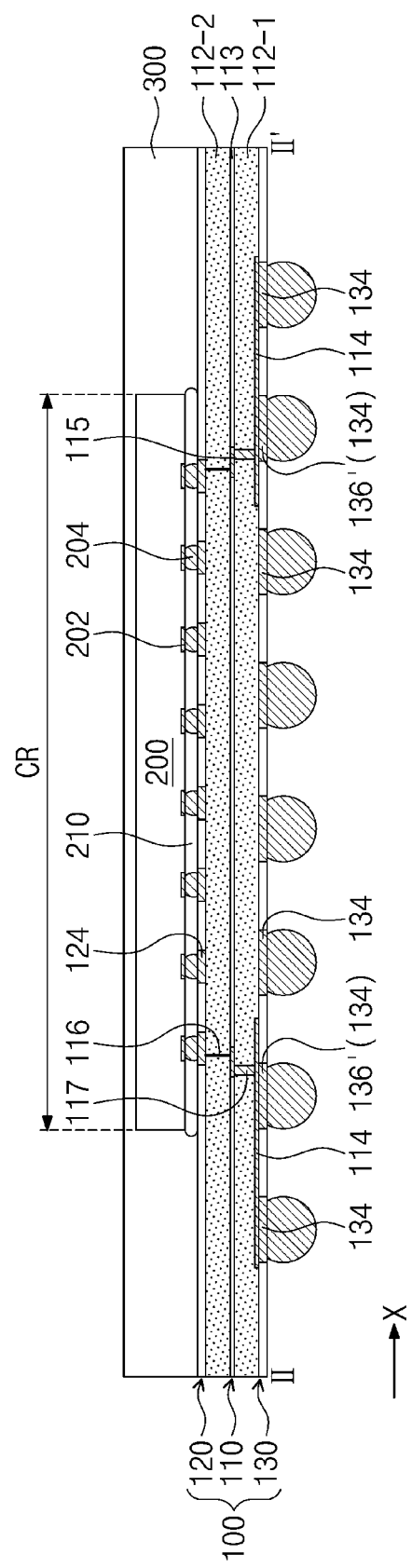
FIG. 5 is a cross-sectional view illustrating a semiconductor device according to some example embodiments of the present inventive concepts.
Figure 6:
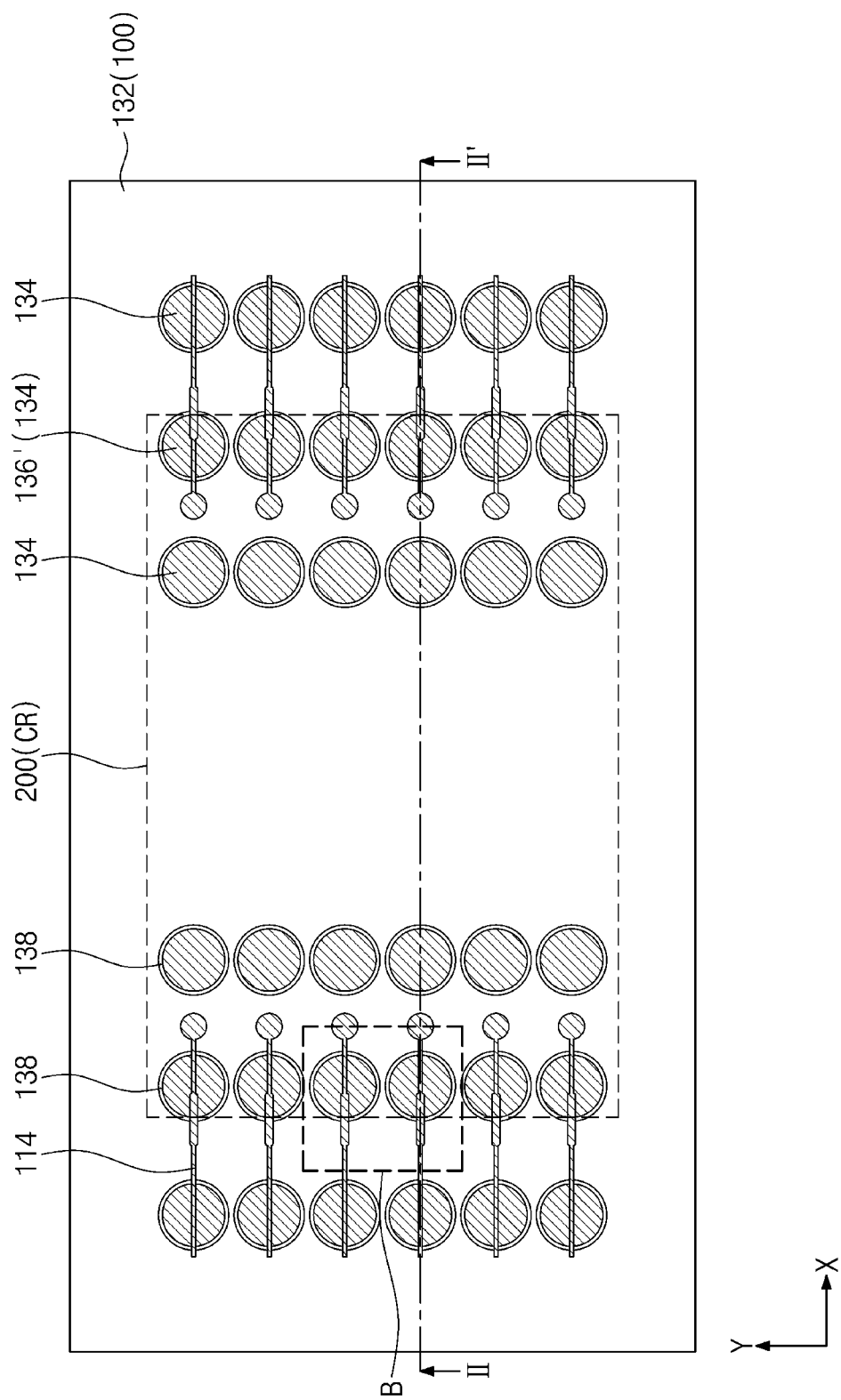
FIG. 6 is a plan view illustrating a semiconductor device according to some example embodiments of the present inventive concepts.
Figure 7:
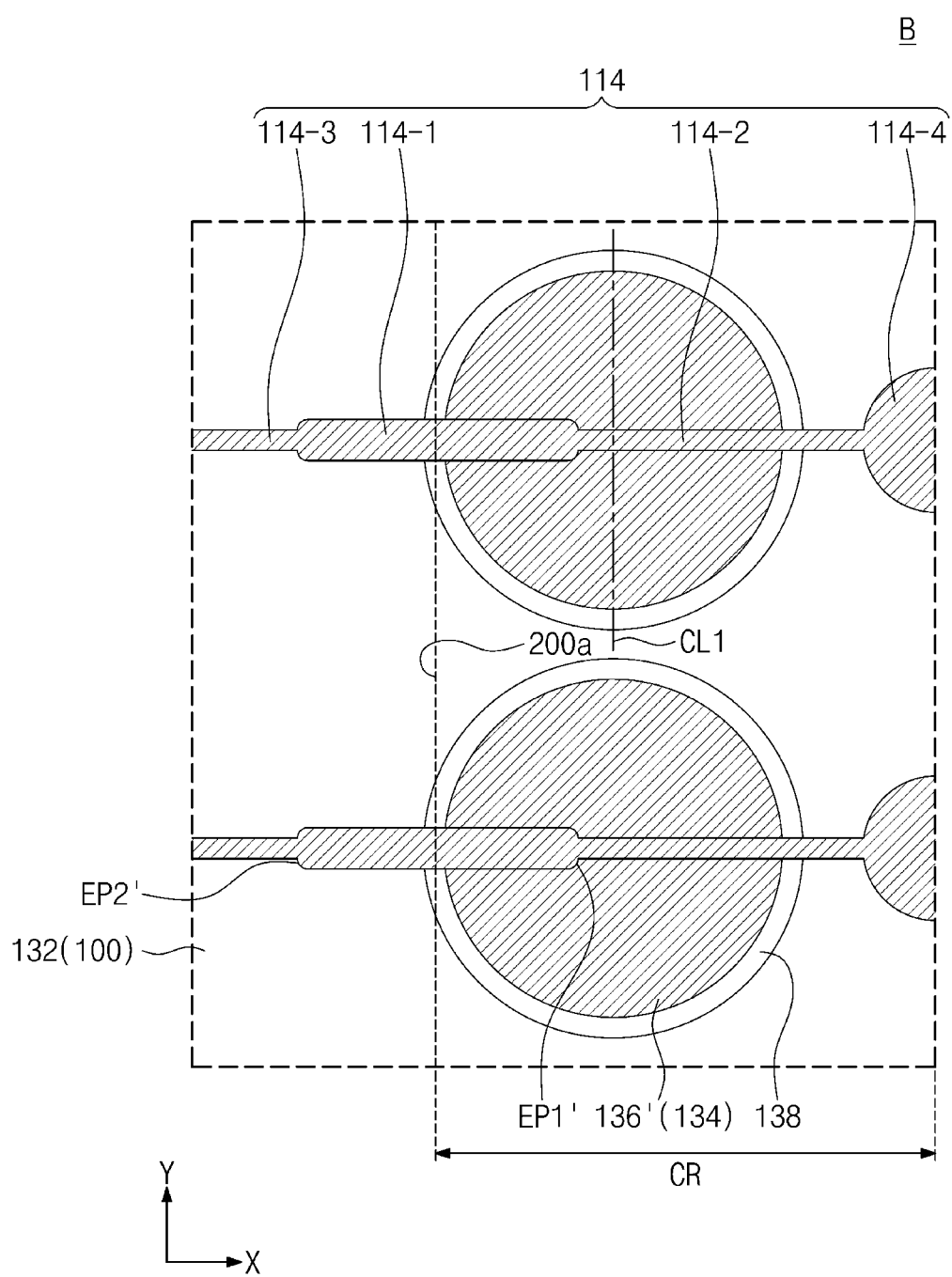
FIG. 7 is an enlarged view illustrating signal wiring lines of a semiconductor device according to some example embodiments of the present inventive concepts.

FIG. 5 is a cross-sectional view illustrating a semiconductor device according to some example embodiments of the present inventive concepts. FIG. 6 is a plan view illustrating a semiconductor device according to some example embodiments of the present inventive concepts. FIG. 7 is an enlarged view illustrating signal wiring lines of a semiconductor device according to some example embodiments of the present inventive concepts. FIG. 6 is a plan view showing a top of a lower layer of a substrate of FIG. 5, and FIG. 5 corresponds to a cross-sectional view taken along a line II-IF of FIG. 6. FIG. 7 is an enlarged view of a region 13' of FIG. 6. In FIGS. 6 and 7, a portion overlapping a semiconductor chip 200 or a chip mounting region CR is illustrated by a dotted line for the purpose of ease and convenience in explanation and illustration. In the present embodiments, the descriptions to the same technical features as in the embodiments of FIGS. 1 to 4 will be omitted for the purpose of ease and convenience in explanation. For example, differences between the present embodiments and the embodiments of FIGS. 1 to 4 will be mainly described hereinafter. The same components as in the aforementioned embodiments will be indicated by the same reference designators.

Referring to FIGS. 5 to 7, boundary ball lands 136' among the ball lands 134 of the lower layer 130 may be disposed near the chip mounting region CR. The boundary ball lands 136' may be disposed adjacent to the side surface 200a of the semiconductor chip 200 in the first direction X. For example, the boundary ball lands 136' may be located under the semiconductor chip 200, e.g., in a plan view. The boundary ball lands 136' may be arranged along the side surface 200a of the semiconductor chip 200, which extends in the second direction Y. The other ball lands 134 except the boundary ball lands 136' may be located under the semiconductor chip 200 and/or may be located outside the semiconductor chip 200 in a plan view. Here, the other ball lands 134 except the boundary ball lands 136' may be spaced apart from the side surface 200a of the semiconductor chip 200 in a plan view.

A portion of a space region 138 surrounding the boundary ball land 136' may be located under the side surface 200a of the semiconductor chip 200. For example, the space region 138 may partially and vertically overlap the side surface 200a of the semiconductor chip 200. When the semiconductor chip 200 is mounted on the substrate 100, pressure applied to the substrate 100 by a weight of the semiconductor chip 200 or pressure applied in a process of mounting the semiconductor chip 200 may be great at an edge (e.g., the side surface 200a) of the semiconductor chip 200. For example, the signal wiring lines 114 and the internal wiring line 116 of the redistribution layer 110 on the space region 138 may be easily damaged or broken. However, according to some embodiments of the inventive concepts, structural stability of the signal wiring line 114 on the space region 138 may be improved.

The redistribution layer 110 may include the core pattern 113 corresponding to the redistribution line in the redistribution layer 110, the wiring via 117 and the signal wiring lines 114 disposed in the first insulating pattern 112-1, and the internal wiring line 116 disposed in the second insulating pattern 112-2. The redistribution line of the redistribution layer 110 may electrically connect the substrate pads 124 of the upper layer 120 to the ball lands 134 of the lower layer 130. The signal wiring lines 114 may be disposed on the ball lands 134 and the lower layer 130 and may be connected directly to the ball lands 134. The wiring via 117 may electrically connect the signal wiring line 114 to the core pattern 113. The internal wiring line 116 may electrically connect the core pattern 113 to the substrate pad 124.

The signal wiring lines 114 may laterally extend from under the semiconductor chip 200 to protrude from the side surface 200a of the semiconductor chip 200, e.g., in a plan view. Here, each of the signal wiring lines 114 may intersect/overlap one of the boundary ball lands 136'. The signal wiring lines 114 may extend from under the side surface 200a of the semiconductor chip 200 in a direction perpendicular to the side surface 200a of the semiconductor chip 200 (i.e., in the first direction X).

Each of the signal wiring lines 114 may include a support pattern 114-1 located on one of the boundary ball lands 136', first and second wiring patterns 114-2 and 114-3 extending from the support pattern 114-1, and a pad pattern 114-4 to which the wiring via 117 is electrically connected, e.g., contact. Hereinafter, one of the signal wiring lines 114 will be described as a representative of the signal wiring lines 114.

The pad pattern 114-4 may be disposed under the semiconductor chip 200. The pad pattern 114-4 may be disposed at a side of the boundary ball land 136' in the first direction X, e.g., in a plan view. The wiring via 117 may be electrically connected to the pad pattern 114-4.

The support pattern 114-1 may be located on the boundary ball land 136'. The support pattern 114-1 may extend in the first direction X perpendicular to the side surface 200a of the semiconductor chip 200. Here, a first end portion EP1' of the support pattern 114-1 may be located on the boundary ball land 136', and a second end portion EP2' of the support pattern 114-1 may be located on the lower passivation layer 132. The first end portion EP1' of the support pattern 114-1 may be located under the semiconductor chip 200. The first end portion EP1' of the support pattern 114-1 may be spaced apart from a center of the boundary ball land 136'. For example, as illustrated in FIG. 7, the first end portion EP1' of the support pattern 114-1 may be spaced apart from the first center line CL1. For example, the first end portion EP1' of the support pattern 114-1 may be located between the side surface 200a of the semiconductor chip 200 and the first center line CL1 of the boundary ball land 136', e.g., in a plan view. The second end portion EP2' of the support pattern 114-1 may be located outside the side surface 200a of the semiconductor chip 200, e.g., in a plan view. For example, the support pattern 114-1 may extend from on the boundary ball land 136' provided under the semiconductor chip 200 onto the lower passivation layer 132 located outside the side surface 200a of the semiconductor chip 200. For example, the second end portion EP2' of the support pattern 114-1 may not vertically overlap the semiconductor chip 200. A portion of the support pattern 114-1 overlapping the space region 138 may be located under the side surface 200a of the semiconductor chip 200. For example, the side surface 200a of the semiconductor chip 200 may vertically overlap the space region 138 and the support pattern 114-1. A length of the support pattern 114-1 in the first direction X may range from 0.4 times to 0.6 times a width of the boundary ball land 136'.

The first wiring pattern 114-2 may electrically connect the support pattern 114-1 and the pad pattern 114-4. For example, the first wiring pattern 114-2 may be disposed under the semiconductor chip 200. A contact point of the first wiring pattern 114-2 and the support pattern 114-1 may be located on the boundary ball land 136'. For example, the contact point of the first wiring pattern 114-2 and the support pattern 114-1 may be a boundary between the first wiring pattern 114-2 and the support pattern 114-1. The first wiring pattern 114-2 may extend from the first end portion EP1' of the support pattern 114-1 located on the boundary ball land 136' to the pad pattern 114-4 in the first direction X.

The second wiring pattern 114-3 may be connected to the support pattern 114-1. For example, the second wiring pattern 114-3 may extend from the second end portion EP2' of the support pattern 114-1 toward another ball land 134 adjacent to the boundary ball land 136' in an opposite direction to the first direction X. The boundary ball land 136' and the other ball land 134 may be electrically connected to the internal wiring line 116 through the pad pattern 114-4, the first wiring pattern 114-2, the support pattern 114-1 and the second wiring pattern 114-3 of the signal wiring line 114.

A width of the support pattern 114-1 may be greater than a width of the first wiring pattern 114-2 and a width of the second wiring pattern 114-3. For example, the widths of the support pattern 114-1 and the first and second wiring patterns 114-2 and 114-3 may be distances between opposite edges of respective patterns in the second direction Y. For example, the width of the support pattern 114-1 may range from 1.5 times to 3 times each of the widths of the first and second wiring patterns 114-2 and 114-3.

The first wiring pattern 114-2, the support pattern 114-1 and the second wiring pattern 114-3 may be aligned or arranged in the first direction X. The first wiring pattern 114-2, the support pattern 114-1, the second wiring pattern 114-3 and the pad pattern 114-4 may constitute one body. For example, the first wiring pattern 114-2, the support pattern 114-1, the second wiring pattern 114-3 and the pad pattern 114-4 may be formed of the same material. For example, the support pattern 114-1, the first and second wiring patterns 114-2 and 114-3, and the pad pattern 114-4 may be integrally formed by the same process forming a conductive pattern.

Figure 8:
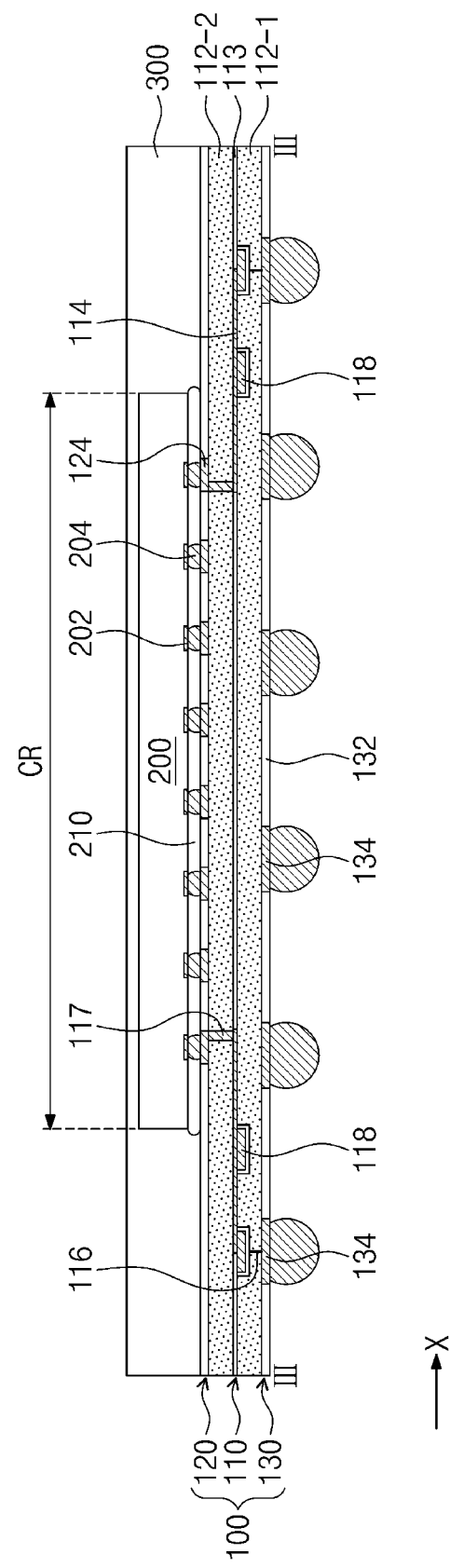
FIG. 8 is a cross-sectional view illustrating a semiconductor device according to some example embodiments of the present inventive concepts.
Figure 9:
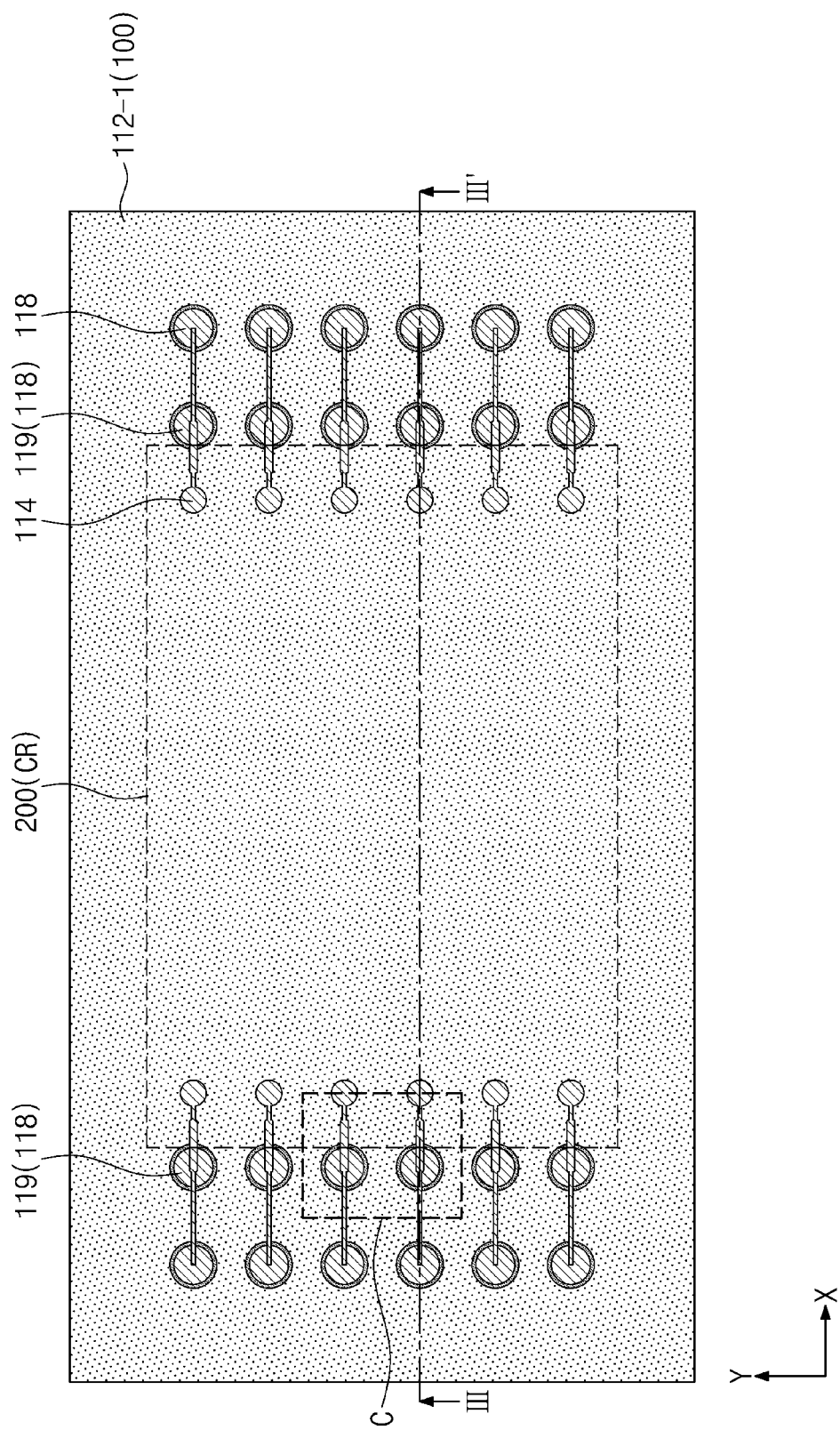
FIG. 9 is a plan view illustrating a semiconductor device according to some example embodiments of the present inventive concepts.
Figure 10:
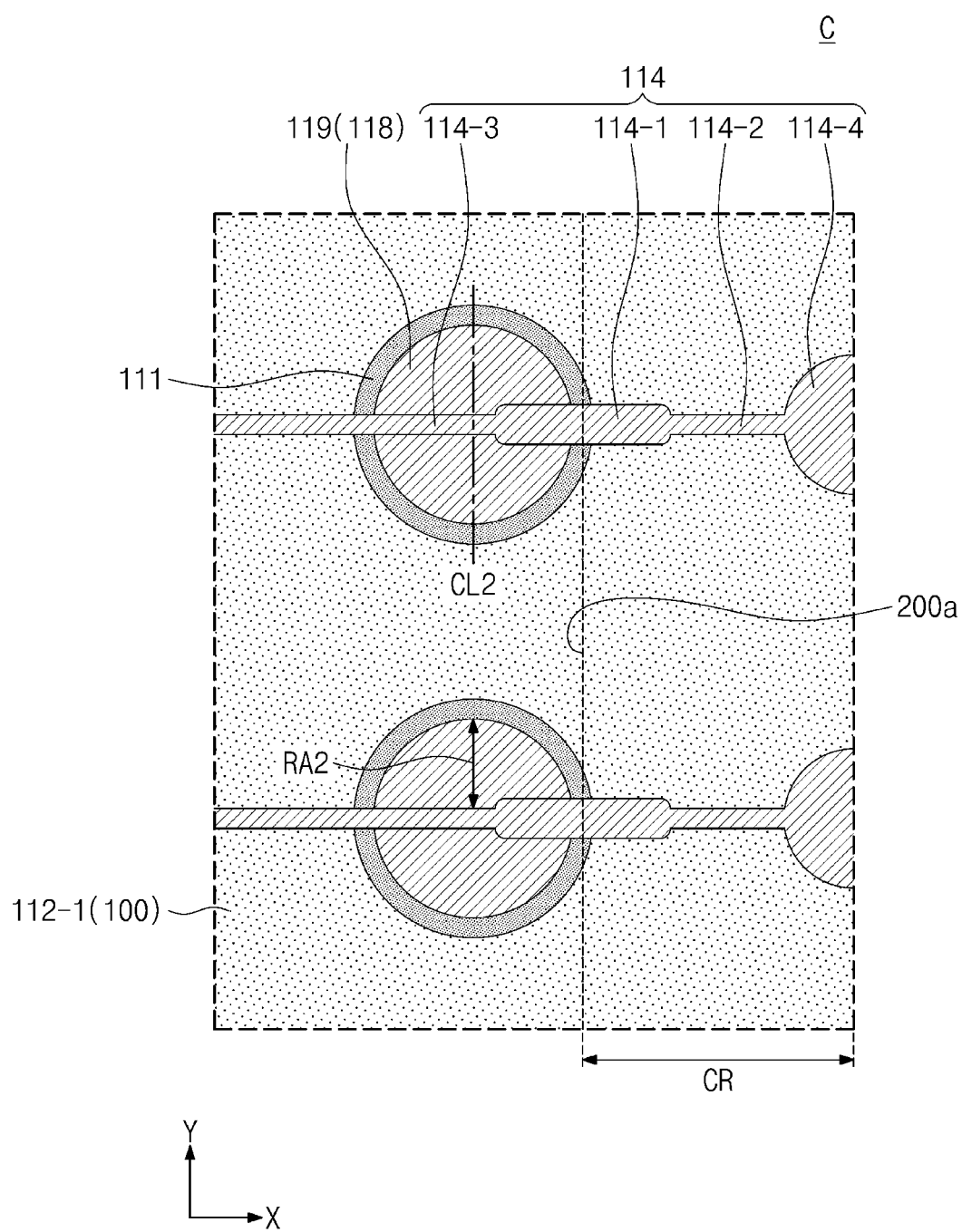
FIG. 10 is an enlarged view illustrating signal wiring lines of a semiconductor device according to some example embodiments of the present inventive concepts.

FIG. 8 is a cross-sectional view illustrating a semiconductor device according to some example embodiments of the present inventive concepts. FIG. 9 is a plan view illustrating a semiconductor device according to some example embodiments of the present inventive concepts. FIG. 10 is an enlarged view illustrating signal wiring lines of a semiconductor device according to some example embodiments of the present inventive concepts. FIG. 9 is a plan view showing a top of a lower layer of a substrate of FIG. 8, and FIG. 8 corresponds to a cross-sectional view taken along a line of FIG. 9. FIG. 10 is an enlarged view of a region 'C' of FIG. 9.

Referring to FIGS. 8 to 10, a substrate 100 may be a multi-layered substrate. The substrate 100 may include a redistribution layer 110, an upper layer 120 provided on the redistribution layer 110, and a lower layer 130 provided under the redistribution layer 110. For example, the upper layer 120 and the lower layer 130 may be disposed on opposite surfaces of the redistribution layer 110, e.g., on a top surface and a bottom surface.

The redistribution layer 110 may be disposed between the upper layer 120 and the lower layer 130. The redistribution layer 110 may include a plurality of wiring layers. For example, the redistribution layer 110 may include first and second insulating patterns 112-1 and 112-2 sequentially stacked, and a core pattern 113 corresponding to a redistribution line interposed between the first insulating pattern 112-1 and the second insulating pattern 112-2.

The first insulating pattern 112-1 may be disposed on the lower layer 130. The first insulating pattern 112-1 may include at least one of pre-preg, flame retardant 4 (FR4), tetrafunctional epoxy, polyphenylene ether, epoxy/polyphenylene oxide, bismaleimide triazine (BT), thermount, cyanate ester, polyimide, or liquid crystal polymer.

Internal wiring lines 116 in the first insulating pattern 112-1 may be wiring lines electrically connecting ball lands 134 of the lower layer 130 to conductive pads 118 to be described later.

Conductive pads 118 and signal wiring lines 114 may be provided on the first insulating pattern 112-1. For example, the signal wiring lines 114 may be some of metal cores of the core pattern 113. In the present embodiments, some of the metal cores of the core pattern 113, which are connected to the conductive pads 118 to transmit signals, may be defined as the signal wiring lines 114. For example, the signal wiring lines 114 may be disposed on the conductive pads 118 in the core pattern 113 provided on the first insulating pattern 112-1 and may be connected directly to the conductive pads 118. The signal wiring lines 114 may correspond to wiring lines extending horizontally to redistribute substrate pads 124, and the conductive pads 118 may correspond to pads connected to the internal wiring lines 116 for vertically connecting the signal wiring lines 114 to the ball lands 134. The signal wiring lines 114 may include or be formed of electrolytically deposited (ED) copper foil, rolled-annealed (RA) copper foil, stainless steel foil, aluminum foil, ultra-thin copper foil, sputtered copper, a copper alloy, or any combination thereof.

The conductive pads 118 may have circular planar shapes. Unlike FIGS. 9 and 10, the conductive pads 118 may have tetragonal or polygonal planar shapes. A width of each of the conductive pads 118 may range from 240 µm to 480 µm. For example, when the conductive pads 118 have the circular planar shapes, a radius RA2 of each of the conductive pads 118 may range from 120 µm to 240 µm. The conductive pads 118 may include or be formed of a metal such as copper (Cu).

Some of the conductive pads 118 may be disposed near a chip mounting region CR. For the purpose of ease and convenience in explanation, the some of the conductive pads 118, which are disposed adjacent to the chip mounting region CR, may be referred to as boundary conductive pads 119. As illustrated in FIGS. 8 to 10, the boundary conductive pads 119 may be disposed adjacent to a side surface 200a of the semiconductor chip 200 in the first direction X. For example, the boundary conductive pads 119 may be located outside the side surface 200a of the semiconductor chip 200 in a plan view. The boundary conductive pads 119 may be arranged along the side surface 200a of the semiconductor chip 200, which extends in the second direction Y. The other conductive pads 118 except the boundary conductive pads 119 may be located under the semiconductor chip 200 and/or may be located outside the semiconductor chip 200 in a plan view. Here, the other conductive pads 118 except the boundary conductive pads 119 may be spaced apart from the side surface 200a of the semiconductor chip 200 in a plan view. For example, some of the other conductive pads 118 may vertically overlap the semiconductor chip 200 in their respective full areas, and some others among the other conductive pads 118 may not vertically overlap the semiconductor chip 200 in any area of the conductive pads 118.

The conductive pads 118 may be located inside the first insulating pattern 112-1, e.g., in a plan view. Here, the conductive pads 118 may be spaced apart from the first insulating pattern 112-1. For example, a material layer 111 may be disposed between the first insulating pattern 112-1 and each of the conductive pads 118. The material layer 111 may be a seed layer for forming the conductive pad 118 in a process of manufacturing the substrate 100 or may be a barrier layer for preventing diffusion of a material of the conductive pad 118 and a material of the first insulating pattern 112-1 into each other. The material layer 111 may cover a side surface and a bottom surface of the conductive pad 118. A thickness of the material layer 111 may range from 20 µm to 40 µm. The material layer 111 may include or be formed of a different material from that of the conductive pad 118. For example, the material layer 111 may include or be formed of gold (Au), titanium (Ti), or tantalum (Ta).

A portion of the material layer 111 surrounding the boundary conductive pad 119 may be located under the side surface 200a of the semiconductor chip 200. For example, the material layer 111 may vertically overlap the side surface 200a of the semiconductor chip 200. When the semiconductor chip 200 is mounted on the substrate 100, pressure applied to the substrate 100 by a weight of the semiconductor chip 200 or pressure applied in a process of mounting the semiconductor chip 200 may be great at an edge (e.g., the side surface 200a) of the semiconductor chip 200. At this time, the signal wiring lines 114 on the conductive pads 118 and the first insulating pattern 112-1 in the redistribution layer 110 may be supported by the conductive pads 118 and the first insulating pattern 112-1, but the signal wiring lines 114 on the material layer 111 in the redistribution layer 110 may not be supported by the conductive pads 118 and the first insulating pattern 112-1. The material layer 111 may include a different material from that of the conductive pad 118, and thus a hardness of the material layer 111 may be different from a hardness of the conductive pad 118. For example, the hardness of the material layer 111 may be less or greater than the hardness of the conductive pad 118 and the insulating pattern 112-1. Thus, pressure applied to the signal wiring line 114 on a boundary of the material layer 111 and the conductive pad 118 or a boundary of the material layer 111 and the first insulating pattern 112-1 may be different from pressure applied to the signal wiring line 114 on the conductive pad 118 or the first insulating pattern 112-1, and the signal wiring line 114 in the redistribution layer 110 may be easily damaged or broken. According to some embodiments of the inventive concepts, structural stability of the signal wiring line 114 on the material layer 111 may be improved. This will be described later in detail with detailed descriptions to a structure of the signal wiring line 114.

The second insulating pattern 112-2 may be disposed on the core pattern 113. The second insulating pattern 112-2 may cover the first insulating pattern 112-1, and the conductive pads 118 and the signal wiring lines 114 provided on the first insulating pattern 112-1. The second insulating pattern 112-2 may include at least one of pre-preg, flame retardant 4 (FR4), tetrafunctional epoxy, polyphenylene ether, epoxy/polyphenylene oxide, bismaleimide triazine (BT), thermount, cyanate ester, polyimide, or liquid crystal polymer.

Wiring vias 117 in the second insulating pattern 112-2 may be wiring lines vertically penetrating the second insulating pattern 112-2 to connect the core pattern 113 to the substrate pads 124 of the upper layer 120.

The signal wiring lines 114 may laterally extend from under the semiconductor chip 200 to protrude from the side surface 200a of the semiconductor chip 200 in a plan view. For example, an end portion of the signal wiring line 114 may be located under and vertically overlap the semiconductor chip 200, and another end portion of the signal wiring line 114 may be located outside the semiconductor chip 200 in a plan view. Here, the signal wiring line 114 may intersect/overlap one of the boundary conductive pads 119 located under the side surface 200a of the semiconductor chip 200. The signal wiring lines 114 may extend from under the side surface 200a of the semiconductor chip 200 in a direction perpendicular to the side surface 200a of the semiconductor chip 200 (i.e., in the first direction X).

Each of the signal wiring lines 114 may include a support pattern 114-1 located on one of the boundary conductive pads 119, first and second wiring patterns 114-2 and 114-3 extending from the support pattern 114-1, and a pad pattern 114-4 to which the wiring via 117 is electrically connected. Hereinafter, one of the signal wiring lines 114 will be described as a representative of the signal wiring lines 114.

The pad pattern 114-4 may be disposed under the semiconductor chip 200. The pad pattern 114-4 may be disposed at a side of the boundary conductive pad 119 in the first direction X, e.g., in a plan view. For example, the pad pattern 114-4 may vertically overlap the semiconductor chip 200 and or the wiring via 117. The wiring via 117 may be electrically connected to the pad pattern 114-4. For example, the wiring via 117 may contact the pad pattern 114-4.

The support pattern 114-1 may be located on the boundary conductive pad 119. The support pattern 114-1 may extend in the direction perpendicular to the side surface 200a of the semiconductor chip 200. For example, the support pattern 114-1 may extend in the first direction X. Here, a first end portion of the support pattern 114-1 may be located on the boundary conductive pad 119, and a second end portion of the support pattern 114-1 may be located on the first insulating pattern 112-1. A portion of the support pattern 114-1 may be located under the semiconductor chip 200 and another portion of the support pattern 114-1 may be located at a side of the semiconductor chip 200, e.g., in a plan view. For example, a portion of the support pattern 114-1 may not vertically overlap the semiconductor chip 200. The first end portion of the support pattern 114-1 may be located outside the side surface 200a of the semiconductor chip 200 in a plan view. As illustrated in FIG. 10, the boundary conductive pad 119 may be divided into two parts by an imaginary second center line CL2 extending in the second direction Y, and the support pattern 114-1 may be spaced apart from the second center line CL2. The second end portion of the support pattern 114-1 may be located under the semiconductor chip 200. For example, the support pattern 114-1 may extend from under the semiconductor chip 200 onto the boundary conductive pad 119 via the material layer 111. For example, the support pattern 114-1 may vertically overlap the semiconductor chip 200, the boundary conductive pad 119, and the material layer 111, e.g., in a direction perpendicular to the first and second directions X and Y. A portion of the support pattern 114-1 overlapping the material layer 111 may be located under the side surface 200a of the semiconductor chip 200. For example, the side surface 200a of the semiconductor chip 200 may vertically overlap the material layer 111 and the support pattern 114-1. A length of the support pattern 114-1 in the first direction X may range from 0.4 times to 0.6 times the width of the boundary conductive pad 119, e.g., in the first direction X or in the second direction Y.

The first wiring pattern 114-2 may electrically connect the support pattern 114-1 and the pad pattern 114-4. For example, the first wiring pattern 114-2 may be disposed under and/or vertically overlap the semiconductor chip 200. The first wiring pattern 114-2 may extend from the support pattern 114-1 to the pad pattern 114-4 in the first direction X.

The second wiring pattern 114-3 may be connected to the support pattern 114-1. For example, the second wiring pattern 114-3 may extend from the support pattern 114-1 on the boundary conductive pad 119 toward another conductive pad 118 adjacent to the boundary conductive pad 119 in an opposite direction to the first direction X. A contact point of the second wiring pattern 114-3 and the support pattern 114-1 may be located on the boundary conductive pad 119. For example, the contact point of the second wiring pattern 114-3 and the support pattern 114-1 may be a boundary between the second wiring pattern 114-3 and the support pattern 114-1.

According to the embodiments of the inventive concepts, the signal wiring line 114 may have the support pattern 114-1 having a relatively thick/large width on the material layer 111. For example, the support pattern 114-1 may have a greater width than the other parts of the signal wiring line 114, e.g., in the second direction Y. Thus, it is possible to prevent the signal wiring line 114 from being damaged by pressure applied from the edge of the semiconductor chip 200. As a result, structural stability of the semiconductor device may be improved. In addition, it is possible to prevent the signal wiring line 114 from being damaged by an external impact or pressure applied in a process of mounting the semiconductor chip, and thus electrical characteristics of the semiconductor device may be improved.

In the embodiments of FIGS. 8 to 10, the boundary conductive pads 119 are located outside the side surface 200a of the semiconductor chip 200 in a plan view. However, embodiments of the inventive concepts are not limited thereto. Like the boundary ball lands 136' disposed under the semiconductor chip 200 in FIGS. 5 to 7, the boundary conductive pads 119 may be located under (e.g., vertically overlap) the semiconductor chip 200. The boundary conductive pads 119 may be arranged along the side surface 200a of the semiconductor chip 200, which extends in the second direction Y. The other conductive pads 118 except the boundary conductive pads 119 may be located under the semiconductor chip 200 and/or may be located outside the semiconductor chip 200 in a plan view.

A portion of the material layer 111 surrounding the boundary conductive pad 119 may be located under the side surface 200a of the semiconductor chip 200. When the semiconductor chip 200 is mounted on the substrate 100, pressure applied to the substrate 100 by a weight of the semiconductor chip 200 and/or pressure applied in a process of mounting the semiconductor chip 200 may be great at the edge (e.g., the side surface 200a) of the semiconductor chip 200. For example, the signal wiring line 114 of the redistribution layer 110 on the material layer 111 may be easily damaged or broken, e.g., by the pressure. However, according to the embodiments of the inventive concepts, structural stability of the signal wiring line 114 on the material layer 111 may be improved.

Figure 11:
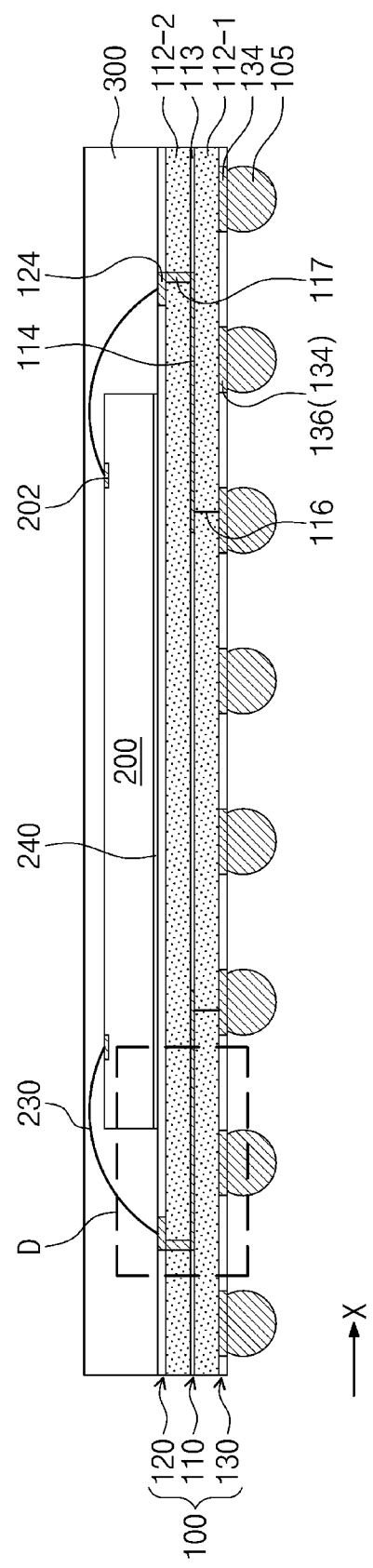
FIG. 11 is a cross-sectional view illustrating a semiconductor device according to some example embodiments of the present inventive concepts.
Figure 12:
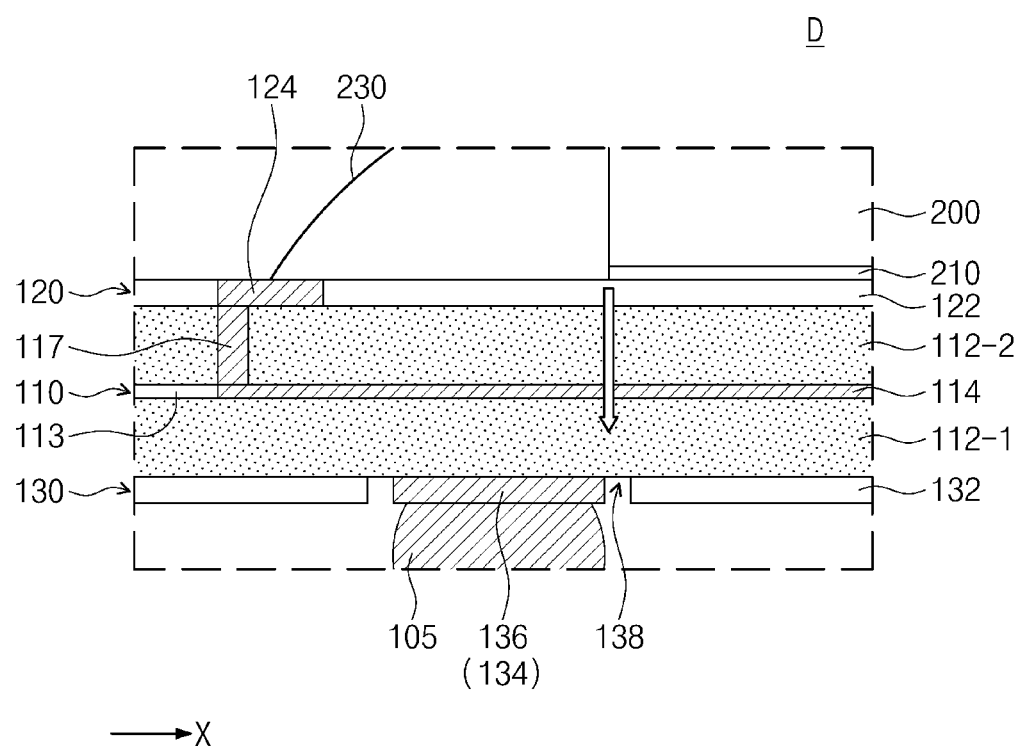
FIG. 12 is an enlarged view illustrating signal wiring lines of a semiconductor device according to some example embodiments of the present inventive concepts.
Figure 13:
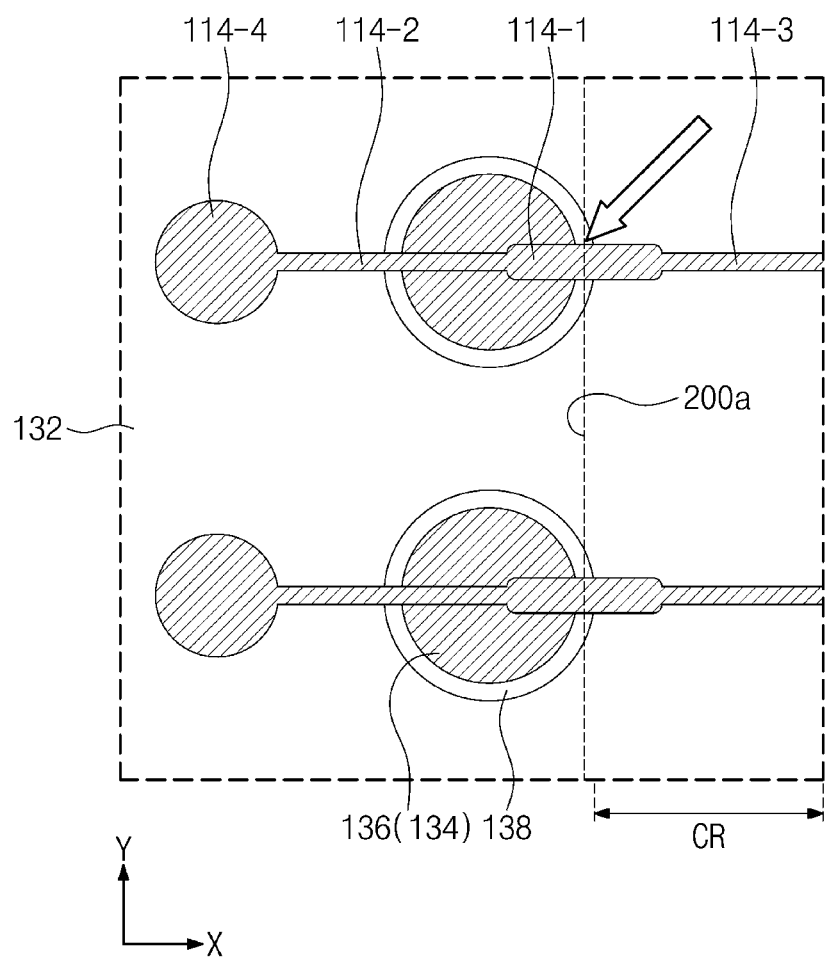
FIG. 13 is an enlarged view illustrating signal wiring lines of a semiconductor device according to some example embodiments of the present inventive concepts.

FIG. 11 is a cross-sectional view illustrating a semiconductor device according to some example embodiments of the present inventive concepts. FIG. 12 is an enlarged view illustrating signal wiring lines of a semiconductor device according to some example embodiments of the present inventive concepts. FIG. 12 is an enlarged view of a region 'D' of FIG. 11. FIG. 13 is an enlarged view illustrating signal wiring lines of a semiconductor device according to some example embodiments of the present inventive concepts. FIG. 13 corresponds to a plan view illustrating the region 'D' of FIG. 12.

Referring to FIGS. 11 to 13, a semiconductor chip 200 may be mounted on a substrate 100. The semiconductor chip 200 may have a bottom surface facing the substrate 100 and a top surface opposite to the bottom surface. The semiconductor chip 200 may include at least one integrated device therein. The at least one integrated device may be formed in an upper portion of the semiconductor chip 200. For example, the top surface of the semiconductor chip 200 may be an active surface. In some embodiments, the semiconductor chip 200 may be a memory semiconductor chip. Alternatively, the semiconductor chip 200 may be a logic semiconductor chip.

The semiconductor chip 200 may be mounted on the substrate 100 by a wire bonding method. For example, the semiconductor chip 200 may be disposed face-up on the substrate 100. For example, the semiconductor chip 200 may be disposed in such a way that an inactive surface of the semiconductor chip 200 faces the substrate 100. The semiconductor chip 200 may have first chip pads 202 provided on the active surface (i.e., the top surface) of the semiconductor chip 200. The first chip pads 202 may be electrically connected to the at least one integrated device of the semiconductor chip 200. The semiconductor chip 200 may be connected to the substrate 100 through bonding wires 230. The bonding wires 230 may electrically connect the first chip pads 202 of the semiconductor chip 200 to substrate pads 124 of the substrate 100.

The substrate 100 may be a multi-layered substrate. The substrate 100 may include a redistribution layer 110, an upper layer 120 provided on the redistribution layer 110, and a lower layer 130 provided under the redistribution layer 110.

The redistribution layer 110 may be disposed between the upper layer 120 and the lower layer 130. The redistribution layer 110 may include first and second insulating patterns 112-1 and 112-2 sequentially stacked, and a core pattern 113 corresponding to a redistribution line/circuit interposed between the first insulating pattern 112-1 and the second insulating pattern 112-2.

The upper layer 120 may include an upper passivation layer 122 and the substrate pads 124. At least a portion of each of the substrate pads 124 may not be covered by the upper passivation layer 122 but may be exposed at a top surface of the upper layer 120. The substrate pads 124 may be pads electrically connected to the semiconductor chip 200. The substrate pads 124 may be disposed on a portion of a top surface of the substrate 100, on which the semiconductor chip 200 is not mounted, i.e., an outer portion of the top surface of the substrate 100. For example, the substrate pads 124 may not vertically overlap the semiconductor chip 200.

The lower layer 130 may include a lower passivation layer 132 and ball lands 134. At least a portion of each of the ball lands 134 may not be covered by the lower passivation layer 132 but may be exposed at a bottom surface of the lower layer 130. The ball lands 134 may be pads on which external terminals 105 are provided. For example, the external terminals 105 may contact the ball lands 134.

The redistribution layer 110 may be disposed between the upper layer 120 and the lower layer 130. The redistribution layer 110 may include the core pattern 113, and the first and second insulating patterns 112-1 and 112-2 covering a bottom surface and a top surface of the core pattern 113, respectively.

The core pattern 113 may correspond to a wiring line/circuit for redistributing the substrate pads 124. For example, the core pattern 113 may electrically connect the substrate pads 124 and ball lands 134 disposed different positions from each other in a plan view. For example, the core pattern 113 may include a plurality of metal cores spaced apart from each other, e.g., in a plan view or may include one metal core of which a portion is removed (e.g. patterned), e.g., in a plan view. The core pattern 113 may be buried in an insulating portion if necessary.

The first and second insulating patterns 112-1 and 112-2 may include at least one of pre-preg, flame retardant 4 (FR4), tetrafunctional epoxy, polyphenylene ether, epoxy/polyphenylene oxide, bismaleimide triazine (BT), thermount, cyanate ester, polyimide, or liquid crystal polymer.

The substrate pads 124 may be electrically connected to the ball lands 134 through wiring lines of the redistribution layer 110. For example, signal wiring lines 114 of the core pattern 113 of the redistribution layer 110 may be electrically connected to the substrate pads 124 through wiring vias 117 provided in the second insulating pattern 112-2. For example, the signal wiring lines 114 of the core pattern 113 of the redistribution layer 110 may be electrically connected to the ball lands 134 through internal wiring lines 116 provided in the first insulating pattern 112-1.

Some of the ball lands 134 of the lower layer 130 may be disposed near a chip mounting region CR. For the purpose of ease and convenience in explanation, the some of the ball lands 134, which are disposed adjacent to the chip mounting region CR, may be referred to as boundary ball lands 136. The boundary ball lands 136 may be disposed adjacent to a side surface 200a of the semiconductor chip 200 in the first direction X. For example, each of distances between the semiconductor chip 200 and the boundary ball lands 136 in the first direction X may be less than a diameter of the boundary ball lands 136 in a plan view. For example, the boundary ball lands 136 may be located outside the side surface 200a of the semiconductor chip 200, e.g., in a plan view.

The ball lands 134 may be located inside the lower passivation layer 132 in a plan view. Here, the ball lands 134 may be spaced apart from the lower passivation layer 132. For example, a gap may be formed between the ball lands 134 and the lower passivation layer 132, e.g., in a plan view. A space/gap between the ball land 134 and the lower passivation layer 132 may be referred to and/or defined as a space region 138.

A portion of the space region 138 surrounding the boundary ball land 136 may be located under the side surface 200a of the semiconductor chip 200. When the semiconductor chip 200 is mounted on the substrate 100, pressure (indicated by thick arrows in FIGS. 12 and 13) applied to the substrate 100 by a weight of the semiconductor chip 200 or pressure applied in a process of mounting the semiconductor chip 200 may be great at an edge of the semiconductor chip 200. At this time, the signal wiring lines 114 and the internal wiring line 116 of the redistribution layer 110 on the ball lands 134 and the lower passivation layer 132 may be supported by the ball lands 134 and the lower passivation layer 132, but the signal wiring lines 114 and the internal wiring line 116 of the redistribution layer 110 on the space region 138 may not be supported by the ball lands 134 and the lower passivation layer 132. For example, the signal wiring lines 114 and the internal wiring line 116 of the redistribution layer 110 on the space region 138 may be easily damaged or broken.

The signal wiring lines 114 may be provided on the first insulating pattern 112-1. For example, the signal wiring lines 114 may be some of the metal cores of the core pattern 113. In the present embodiments, the some of the metal cores of the core pattern 113, which are used to transmit signals, may be defined as the signal wiring lines 114. The signal wiring lines 114 may correspond to wiring lines extending horizontally to redistribute the substrate pads 124. The signal wiring lines 114 may be disposed in the core pattern 113 on the first insulating pattern 112-1. The signal wiring lines 114 may extend from under the substrate pads 124 to under the semiconductor chip 200. For example, an end portion of the signal wiring line 114 may be located under the semiconductor chip 200, and another end portion of the signal wiring line 114 may be located under the substrate pad 124. Here, the signal wiring line 114 may intersect/overlap one of the boundary ball lands 136 located under the side surface 200a of the semiconductor chip 200. The signal wiring lines 114 may extend from under the side surface 200a of the semiconductor chip 200 in a direction perpendicular to the side surface 200a of the semiconductor chip 200 (i.e., in the first direction X).

Each of the signal wiring lines 114 may include a support pattern 114-1 located on one of the boundary ball lands 136, first and second wiring patterns 114-2 and 114-3 extending from the support pattern 114-1, and a pad pattern 114-4 to which the wiring via 117 is connected. Hereinafter, one of the signal wiring lines 114 will be described as a representative of the signal wiring lines 114.

The pad pattern 114-4 may be disposed outside the side surface 200a of the semiconductor chip 200, e.g., in a plan view. For example, the pad pattern 114-4 may not vertically overlap the semiconductor chip 200. The pad pattern 114-4 may be disposed at a side of the boundary ball land 136 in the first direction X, e.g., in a plan view. The wiring via 117 may be electrically connected to the pad pattern 114-4. For example, the wiring via 117 may contact the pad pattern 114-4.

The support pattern 114-1 may be located on the boundary ball land 136. The support pattern 114-1 may extend in the direction perpendicular to the side surface 200a of the semiconductor chip 200. For example, the support pattern 114-1 may extend in the first direction X. Here, a first end portion of the support pattern 114-1 may be located on the boundary ball land 136, and a second end portion of the support pattern 114-1 may be located on the first insulating pattern 112-1. A portion of the support pattern 114-1 may be located under the semiconductor chip 200 and another portion of the support pattern 114-1 may be located at a side of the semiconductor chip 200, e.g., in a plan view. For example, a first portion of the support pattern 114-1 may vertically overlap the semiconductor chip 200, and a second portion of the support pattern 114-1 may not vertically overlap the semiconductor chip 200. The first end portion of the support pattern 114-1 may be located outside the side surface 200a of the semiconductor chip 200, e.g., in a plan view. The second end portion of the support pattern 114-1 may be located under the semiconductor chip 200. For example, the support pattern 114-1 may extend from under the semiconductor chip 200 onto the boundary ball land 136 via the space region 138. A portion of the support pattern 114-1 overlapping the space region 138 may be located under the side surface 200a of the semiconductor chip 200. For example, the side surface 200a of the semiconductor chip 200 may vertically overlap the space region 138 and the support pattern 114-1.

The first wiring pattern 114-2 may electrically connect the support pattern 114-1 and the pad pattern 114-4. For example, the first wiring pattern 114-2 may be disposed outside the side surface 200a of the semiconductor chip 200, e.g., in a plan view. For example, the first wiring pattern 114-2 may not vertically overlap the semiconductor chip 200. The first wiring pattern 114-2 may extend from the support pattern 114-1 to the pad pattern 114-4 in an opposite direction to the first direction X.

The second wiring pattern 114-3 may be connected to the support pattern 114-1. For example, the second wiring pattern 114-3 may be disposed under the semiconductor chip 200 and may extend from the support pattern 114-1 in the first direction X. A contact point of the first wiring pattern 114-2 and the support pattern 114-1 may be located on the boundary ball land 136. For example, the boundary between the first wiring pattern 114-2 and the support pattern 114-1 may vertically overlap and/or contact the boundary ball land 136.

According to the embodiments of the inventive concepts, the signal wiring line 114 may have the support pattern 114-1 having a relatively thick/large width (e.g., wider than its vicinity) on the space region 138. Thus, it is possible to prevent the signal wiring line 114 from being damaged by pressure applied from the edge of the semiconductor chip 200. As a result, structural stability of the semiconductor device may be improved. In addition, it is possible to prevent the signal wiring line 114 from being damaged by an external impact or pressure applied in a process of mounting the semiconductor chip, and thus electrical characteristics of the semiconductor device may be improved.

In the semiconductor device according to the embodiments of the inventive concepts, the signal wiring line may have the support pattern having a relatively great width on the space region. Thus, it is beneficial to prevent the signal wiring line from being damaged by pressure applied from the edge of the semiconductor chip. As a result, structural stability of the semiconductor device may be improved. In addition, it is beneficial to prevent the signal wiring line from being damaged by an external impact or pressure applied in a process of mounting the semiconductor chip, and thus electrical characteristics of the semiconductor device may be improved.

What is claimed is:

1. A semiconductor device comprising:
   a substrate including a redistribution layer, a ball land provided on a bottom surface of the redistribution layer, a passivation layer surrounding the ball land on the bottom surface of the redistribution layer and spaced apart from the ball land by a space region formed between the passivation layer and the ball land, and a signal wiring line provided in the redistribution layer and on the ball land;
   a semiconductor chip mounted on the substrate; and
   an external terminal adhered to the ball land,
   wherein the signal wiring line comprises:
      a first wiring pattern extending in a first direction perpendicular to one side surface of the semiconductor chip; and
      a support pattern disposed under the one side surface of the semiconductor chip, the first wiring pattern having a first width in a second direction, and the support pattern having a second width in the second direction, wherein the second width is greater than the first width, and the second direction is parallel to a bottom surface of the substrate and perpendicular to the first direction,
   wherein the space region is disposed under the one side surface of the semiconductor chip; and
   wherein the support pattern extends from the passivation layer onto the ball land across the space region below the one side surface of the semiconductor chip in a plan view.

2. The semiconductor device of claim 1, wherein, in the second direction, the second width of the support pattern is in a range from 1.5 times to 3 times the first width of the first wiring pattern.

3. The semiconductor device of claim 1, wherein the first wiring pattern is connected to one end of the support pattern, and a second wiring pattern is connected to another end of the support pattern.

4. The semiconductor device of claim 1, wherein a first end of the support pattern is located between a center of the ball land and the semiconductor chip in a plan view.

5. The semiconductor device of claim 1, wherein a length of the support pattern in the first direction is in a range from 0.4 times to 0.6 times a width of the ball land in the first direction.

6. The semiconductor device of claim 1, wherein the support pattern extends in the first direction perpendicular to the one side surface of the semiconductor chip.

7. The semiconductor device of claim 1, wherein a width of the space region is in a range from 20 μm to 40 μm.

8. The semiconductor device of claim 1, wherein the ball land is disposed outside the one side surface of the semiconductor chip when viewed in a plan view.

9. The semiconductor device of claim 1, wherein the ball land is disposed under the semiconductor chip.

10. The semiconductor device of claim 1, wherein the first wiring pattern and the support pattern constitute one body.

11. The semiconductor device of claim 1, wherein the ball land is a boundary ball land disposed adjacent to a chip mounting region.

12. The semiconductor device of claim 1, wherein the support pattern extends from the passivation layer onto the ball land across the space region on a first side of the ball land and the first wiring pattern extends from the passivation layer onto ball land across the space region on a second side of the ball land.

13. The semiconductor device of claim 1, wherein the width of the signal wiring line changes on the ball land.

* * * * *